US009362897B2

(12) United States Patent
Holzmann

(10) Patent No.: US 9,362,897 B2
(45) Date of Patent: Jun. 7, 2016

(54) METHOD AND APPARATUS FOR AN INTEGRATED PN-JUNCTION OSCILLATOR

(71) Applicant: NUVOTON TECHNOLOGY CORPORATION, Hsinchu (TW)

(72) Inventor: Peter Holzmann, San Jose, CA (US)

(73) Assignee: NUVOTON TECHNOLOGY CORPORATION, Hsin-Chu (TW)

( * ) Notice: Subject to any disclaimer, the term of this patent is extended or adjusted under 35 U.S.C. 154(b) by 0 days.

(21) Appl. No.: 14/517,775

(22) Filed: Oct. 17, 2014

(65) Prior Publication Data

US 2016/0112005 A1    Apr. 21, 2016

(51) Int. Cl.
*H03K 3/03*    (2006.01)
(52) U.S. Cl.
CPC .................. *H03K 3/0315* (2013.01)
(58) Field of Classification Search
CPC ..................................... H03K 3/0315
USPC ........................................... 331/57
See application file for complete search history.

(56) References Cited

U.S. PATENT DOCUMENTS

| 7,245,151 | B2* | 7/2007 | Baude ................ G06K 19/0713 235/472.02 |
| 7,760,033 | B2* | 7/2010 | Podmanik ............ H03K 3/0315 331/177 R |
| 8,330,478 | B2* | 12/2012 | Myers .................. H03K 3/0315 324/750.3 |
| 8,810,298 | B2* | 8/2014 | Subramanian ....... G06K 7/0008 327/261 |
| 2010/0134149 | A1* | 6/2010 | Bol .................. H03K 19/00361 326/103 |
| 2013/0134984 | A1* | 5/2013 | Terada ............... G01R 31/2621 324/509 |

* cited by examiner

*Primary Examiner* — Ryan Johnson
(74) *Attorney, Agent, or Firm* — Kilpatrick Townsend Stockton LLP

(57) ABSTRACT

An integrated oscillator circuit has a plurality oscillator stages including a first oscillator stage, an odd number of intermediate oscillator stages, and a last oscillator stage arranged in series. Each of the oscillator stages has a reverse-biased diode device and a transistor coupled in series between a power supply and a ground. Each diode device has an anode and a cathode, and each transistor has a control terminal for controlling a current flow from a first terminal to a second terminal. In each oscillator stage, the anode of the diode is coupled to the first terminal of the transistor at an internal node. The control terminal of the transistor in each oscillator stage is coupled to the internal node of a proceeding oscillator stage. Further, the control terminal of the transistor in the first oscillator stage is coupled to the internal node of the last oscillator stage.

18 Claims, 4 Drawing Sheets

METHOD AND APPARATUS FOR AN INTEGRATED PN-JUNCTION OSCILLATOR

CROSS-REFERENCES TO RELATED APPLICATIONS

NOT APPLICABLE

BACKGROUND OF THE INVENTION

The present invention relates generally to electronic circuits. More particularly, embodiments of the present invention relate to the field of integrated oscillator circuits for controllers and, in particular, controllers for ultra-low power battery applications.

Integrated circuit oscillators are often used in (micro)-controller circuits. In addition, integrated oscillators are also used to provide clock signals and ramp signals (or sawtooth signals) in pulse width modulation (PWM) based systems, such as those used in switch mode power supplies (SMPS) and amplifier circuits.

FIG. 1 is a simplified block diagram illustrating a system 100, in which a controller is configured for frequent power-on and power-off operations. In this example, the (micro)-controller circuit 110 is in a power down state, while it monitors the state of a terminal GPIO1. In this example, GPIO1 is connected to a temperature actuated switch 120, which trips at a preset temperature. An LED (light-emitting-diode) 130 is used to indicate when the temperature actuated switch has tripped, based on operations performed by the controller core. When the temperature actuated switch trips, the logic powers up the controller. As shown in FIG. 1, The GPIO1 signal is passed through a debounce filter 112 in order to ensure that the switch has completely changed state to avoid false indications and waste of power through the LED. The debounce filter is coupled to an oscillator 114 for the debounce timer. This debounce filter 112 is continuously monitoring the GPIO, and the oscillator 114 is continuously running while the controller is in a power down state. Therefore, for long battery life, an ultra low power debounce filter and oscillator is desired.

Some conventional integrated circuit oscillators use ring oscillators, with resistors, capacitors, inductors, crystals and MOS invertor stages. These ring oscillators often use precision external voltage and current references. Other conventional integrated circuit oscillators use capacitor charging circuit, but also may rely on external reference circuits and control circuits.

BRIEF SUMMARY OF THE INVENTION

The inventor of this invention has discovered that conventional integrated circuit oscillators often do not satisfy the low power requirements for low power battery operations. As described above, conventional integrated circuit oscillators often require external current and voltage references, as well as complex circuits. Some conventional integrated circuit oscillators may use band gap circuits to provide reference voltages. These designs tend to result in complicated circuits and require high power consumption.

In embodiments of the present invention, an integrated oscillator circuit is provided in which each oscillator stage of a ring oscillator includes a reverse-biased diode coupled in series with a transistor. In embodiments implemented with PN junction diodes and MOS transistor, the oscillation frequency is determined by the reverse leakage current of the diode, and the threshold voltage and gate capacitance of the MOS transistors. The circuit is simple and cost-effective, and the oscillation frequency can be adjusted with the device parameters described above. With the low reverse leakage current, the power consumption of the oscillator is low. In one specific embodiment, the oscillator is used in a timer for a debounce circuit. However, the oscillator is suited for general ultra-low power applications with relatively low oscillation frequencies.

In embodiments of the present invention, an integrated oscillator circuit includes a reverse-biased first diode device and a first MOS transistor coupled in series between a power supply and a ground. A cathode of the first diode device is coupled to the power supply, an anode of the first diode device is coupled to a drain of the first MOS transistor, and a source of the first MOS transistor is coupled to the ground. The oscillator also has a reverse-biased second diode device and a second MOS transistor coupled in series between the power supply and the ground. A cathode of the second diode device is coupled to the power supply, an anode of the second diode device is coupled to a drain of the second MOS transistor, a source of the second MOS transistor is coupled to the ground, and a gate of the second MOS transistor is coupled to the drain of the first MOS transistor. The oscillator also has a reverse-biased third diode device and a third MOS transistor coupled in series between the power supply and the ground. A cathode of the third diode device is coupled to the power supply, an anode of the third diode device is coupled to a drain of the third MOS transistor, a gate of the third MOS transistor is coupled to the drain of the second MOS transistor, a source of the third MOS transistor is coupled to the ground, and the drain of the third MOS transistor is coupled to a gate of the first MOS transistor.

In an embodiment of the above integrated oscillator circuit, the oscillator is configured to provide a oscillation frequency Fosc that is proportional to the leakage current of the diode devices and is inversely proportional to the gate capacitances and threshold voltages of the MOS transistors. In some embodiments, the first, second, and third diode devices are PN junction diodes.

In another embodiment, the integrated oscillator circuit also has an output buffer circuit that has a fourth MOS transistor having a gate coupled to the drain of the third MOS transistor, a fifth MOS transistor having a gate coupled to the drain of the first MOS transistor, and a sixth and a seventh MOS transistors forming a current mirror. The sixth transistor is coupled to the fourth MOS transistor, and the seventh MOS transistor coupled to the fifth transistor. In an embodiment, the fourth and fifth MOS transistors are NMOS transistors, and the sixth and seventh MOS transistors are PMOS transistors.

In another embodiment, the integrated oscillator circuit also includes an enable transistor having a drain coupled to the gate of the first MOS transistor and a gate for receiving an enable signal.

According to some embodiments of the present invention, an integrated oscillator circuit has a plurality oscillator stages including a first oscillator stage, an odd number of intermediate oscillator stages, and a last oscillator stage arranged in series. Depending on the embodiments, the number of intermediate oscillator stages can be any odd integer, such as 1, 3, 5, 7, 9, ..., etc. For example, in a specific embodiment, there is one intermediate oscillator stage, and the total number of oscillator stages is three. Each of the oscillator stages has a reverse-biased diode device and a transistor coupled in series between a power supply and a ground. Each diode device has an anode and a cathode, and each transistor has a control terminal for controlling a current flow from a first terminal to a second terminal. In each oscillator stage, the anode of the diode is coupled to the first terminal of the transistor at an internal node. The control terminal of the transistor in each oscillator stage is coupled to the internal node of a proceeding oscillator stage. Further, the control terminal of the transistor in the first oscillator stage is coupled to the internal node of the last oscillator stage.

In some embodiments, the diode devices are PN junction diodes. In other embodiments, other rectifying device having a well-defined reverse leakage current, such as Schottky diodes, can also be used. In some embodiments, the transistors can be MOS transistors, such as NMOS or PMOS transistors. In these embodiments, a control terminal is the gate terminal for controlling a current flow from a drain (the first terminal) to a source (the second terminal). In other embodiments, the transistors can be bipolar transistors, such as NPN or PNP transistors. In these embodiments, the control terminal is the base terminal for controlling a current flow from an emitter (the first terminal) to a collector (the second terminal).

In an embodiment, the integrated oscillator circuit is configured to provide a oscillation frequency Fosc that is proportional to the leakage current of the diode devices Id and inversely proportional the amount of charges needed to change the state of the transistor. For an MOS transistor, the amount of charges would be dependent on the gate capacitances and threshold voltages of the transistors. For a bipolar transistor, the amount of charges would be dependent on the charges sufficient to forward bias a base-emitter junction.

In some embodiments, the integrated oscillator circuit also has an output buffer circuit that includes a first transistor having a gate coupled to the internal node of the last oscillator stage, and a second transistor having a gate coupled to the internal node of the first oscillator stage. Integrated oscillator circuit 500 also has a third and a fourth transistors, forming a current mirror. The third transistor is coupled to the first transistor, and the fourth MOS transistor is coupled to the second transistor. In some embodiments, the integrated oscillator circuit further includes an enable transistor having a gate for receiving an enable signal and a first terminal for coupling to the control terminal of the transistor in the first oscillator stage.

A further understanding of the nature and advantages of the present invention may be realized by reference to the remaining portions of the specification and the drawings.

DETAILED DESCRIPTION OF THE INVENTION

The description below makes reference to a series of drawing figures enumerated above. These diagrams are merely an example and should not unduly limit the scope of the claims herein. In connection with the various aspects illustrated and described, one of ordinary skill in the art would recognize other variations, modifications, and alternatives.

Figure 1:
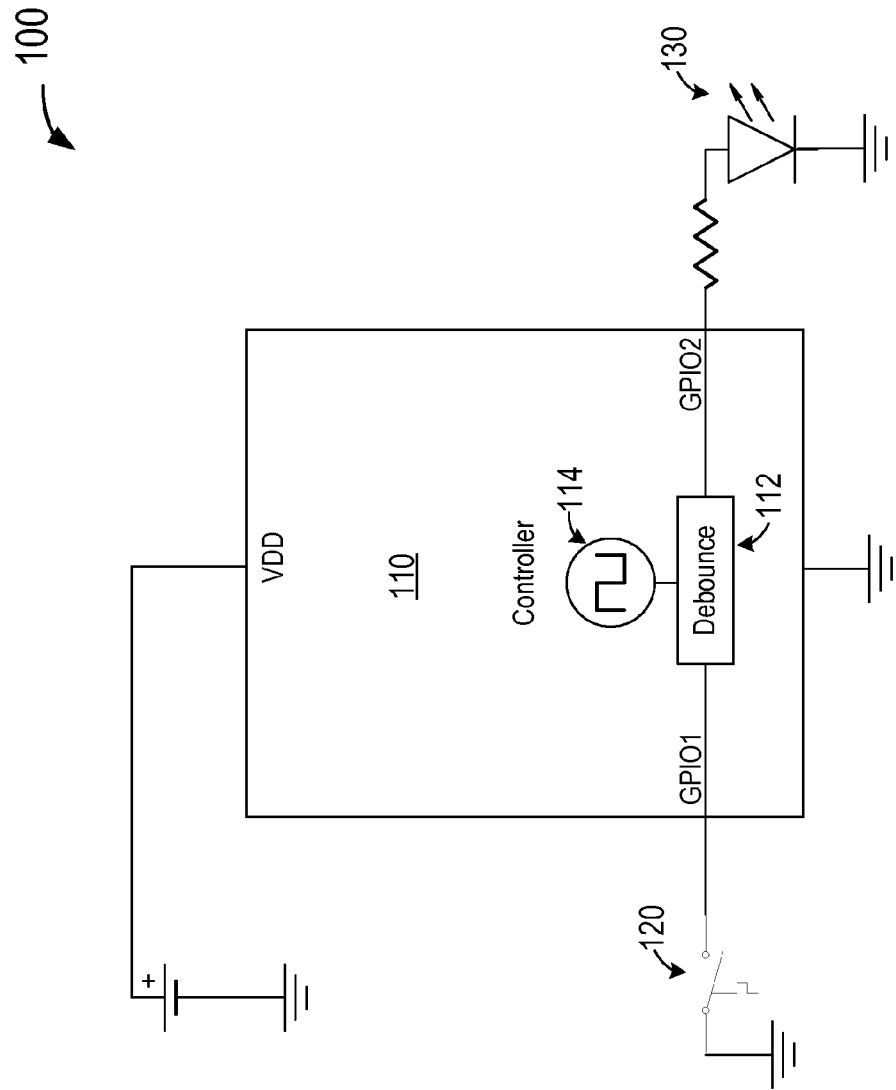
FIG. 1 is a simplified block diagram illustrating a system in which a controller is configured for frequent power-on and power-off operations.
Figure 2:
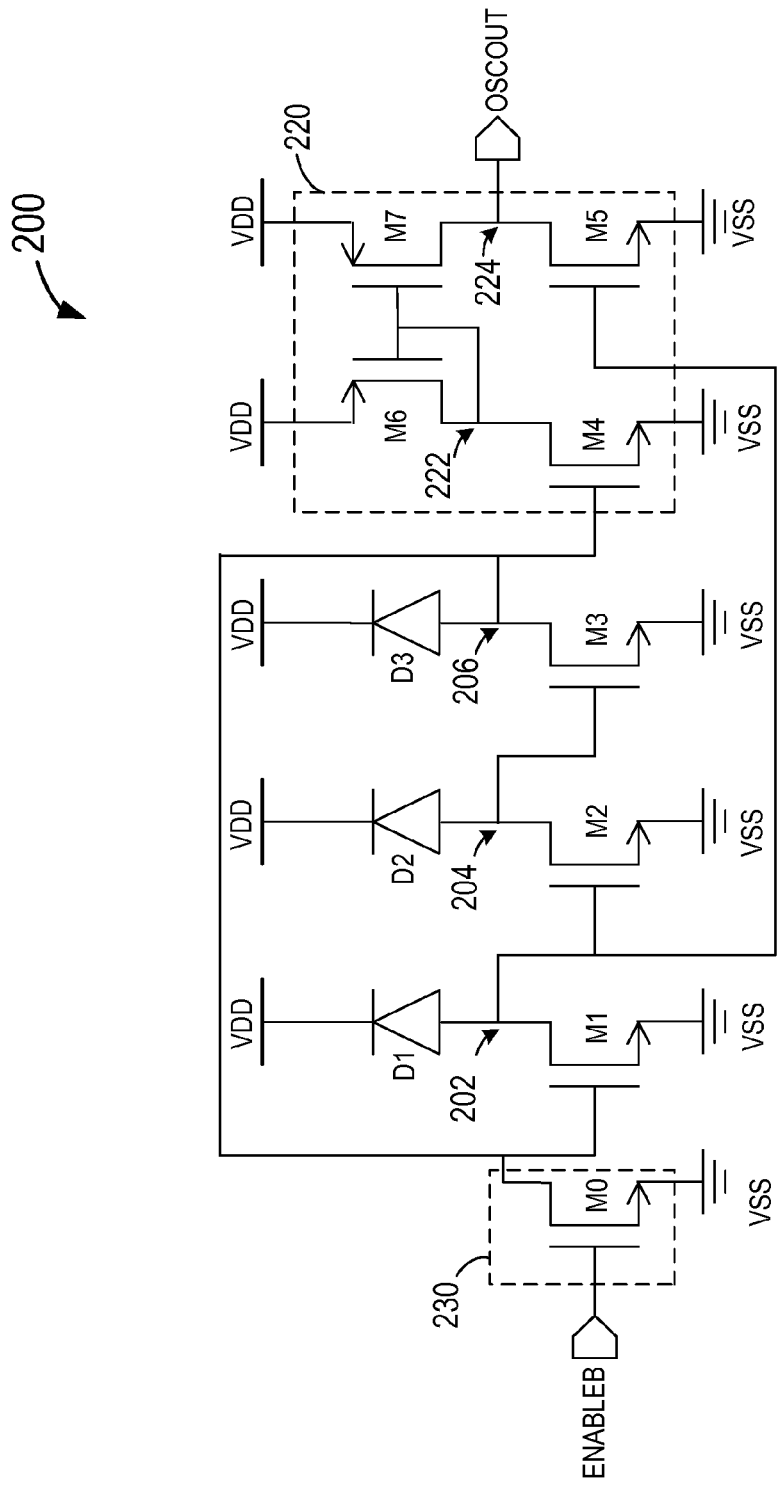
FIG. 2 is a simplified schematic diagram illustrating a PN junction based integrated oscillator according to an embodiment of the present invention.

FIG. 2 is a simplified schematic diagram illustrating a PN junction based integrated oscillator according to an embodiment of the present invention. As shown in FIG. 2, integrated oscillator circuit 200 includes a reverse-biased first diode device D1 and a first MOS transistor M1 coupled in series between a power supply VDD and a ground VSS. A cathode of the first diode device D1 is coupled to the power supply VDD, and an anode of the first diode device D1 is coupled to a drain of the first MOS transistor M1. A source of the first MOS transistor M1 is coupled to the ground VSS. Integrated oscillator circuit 200 also includes a reverse-biased second diode device D2 and a second MOS transistor M2 coupled in series between the power supply VDD and the ground VSS. A cathode of the second diode device D2 is coupled to the power supply VDD, and an anode of the second diode device D2 is coupled to a drain of the second MOS transistor M2. A gate of the second MOS transistor M2 is coupled to the drain of the first MOS transistor M1. Moreover, integrated oscillator circuit 200 also includes a reverse-biased third diode device D3 and a third MOS transistor M3 coupled in series between the power supply VDD and the ground VSS. A cathode of the third diode device D3 is coupled to the power supply VDD, and an anode of the third diode device D3 is coupled to a drain of the third MOS transistor M3. A gate of the third MOS transistor M3 is coupled to the drain of the second MOS transistor M2. Furthermore, the drain of the third MOS transistor M3 is coupled to the gate of the first MOS transistor M1 to complete the ring oscillator configuration.

As shown in FIG. 2, diodes D1, D2, and D3 are connected in the reversed direction, and only reverse leakage current of the diode can flow, such that the gates of the MOS transistors are charged by the reverse leakage currents. These leakage currents are typically very small, in the order of nano Amperes, allowing large time constants and low power operation, without the need of large resistors. The operation of integrated oscillator circuit 200 can be described in the following scenario. Assuming transistor M1 is off, then the reverse leakage current in diode D1 charges the gate of transistor M2. When the gate voltage of transistor M2 is charged up to its threshold voltage Vth, transistor M2 is turned on. Therefore, the drain of the transistor M2 is pulled down to ground, turning off transistor M3 in the next stage of the ring oscillator. At this point, the drain of transistor M3 is high, and the reverse leakage current in diode D3 charges the gate of transistor M1, and the cycle repeats.

As described above, the leakage current charges the gate capacitance, until the gate voltage is large enough to change the drain voltage. Since the drains of the MOS transistors also have leakage currents, in embodiments of the invention, the leakage currents of the diodes are selected to exceed the MOS drain leakage currents. In some embodiments, the first, second, and third diode devices are PN junction diodes. For example, in a specific embodiment, the PN junction diodes are formed using PN well junction diodes.

In FIG. 2, the integrated oscillator circuit 200 also has an output buffer circuit 220 that includes a fourth MOS transistor M4 having a gate coupled to the drain of the third MOS transistor M3, and a fifth MOS transistor M5 having a gate coupled to the drain of the first MOS transistor M1. Moreover, a sixth and a seventh MOS transistors, M6 and M7, form a current mirror. The sixth transistor M6 is coupled to the fourth MOS transistor M4, and the seventh MOS transistor M7 is coupled to the fifth transistor M5. As shown in FIG. 2, the fourth and fifth MOS transistors, M4 and M5, are NMOS transistors, and the sixth and seventh MOS transistors, M6 and M7, are PMOS transistors. In some embodiments, integrated oscillator circuit 200 further includes an enable transistor M0 (230) having a gate for receiving an enable signal ENABLE and a drain coupled to the gate of the first MOS transistor. As shown in FIG. 2, transistor M0 is an NMOS transistor, and if the ENABLEB signal is high, transistor M0 is turned on, pulling down the gate of transistor M1, thus preventing the ring oscillator from operating. On the other hand, if the ENABLEB signal is low, transistor M0 is turned off, allowing the ring oscillator to operate.

As described above, the frequency of the oscillator is determined by the time constant of the charging of gate capacitance Cgate by the leakage current of the diode Id. The time it takes for the gate voltage of the transistor to be charged up to the threshold Vth can be expressed as follow.

$$T = (Cgate \times Vth)/Id$$

Thus the frequency of the ring oscillator is proportional to the inverse of T.

$$Fos \sim Id / (Cgate \times Vth)$$

Therefore, the frequency of the oscillator can be adjusted by selecting proper diode leakage current Id, gate capacitance Cgate, and threshold voltages Vth. For example, the diode leakage current can be adjusted by varying the dopant concentration and/or the area of the diode. The gate capacitance can be adjusted by varying the area of the gate and/or the thickness of the gate dielectric. The threshold voltage can be adjusted by varying the doping concentration.

Figure 3:
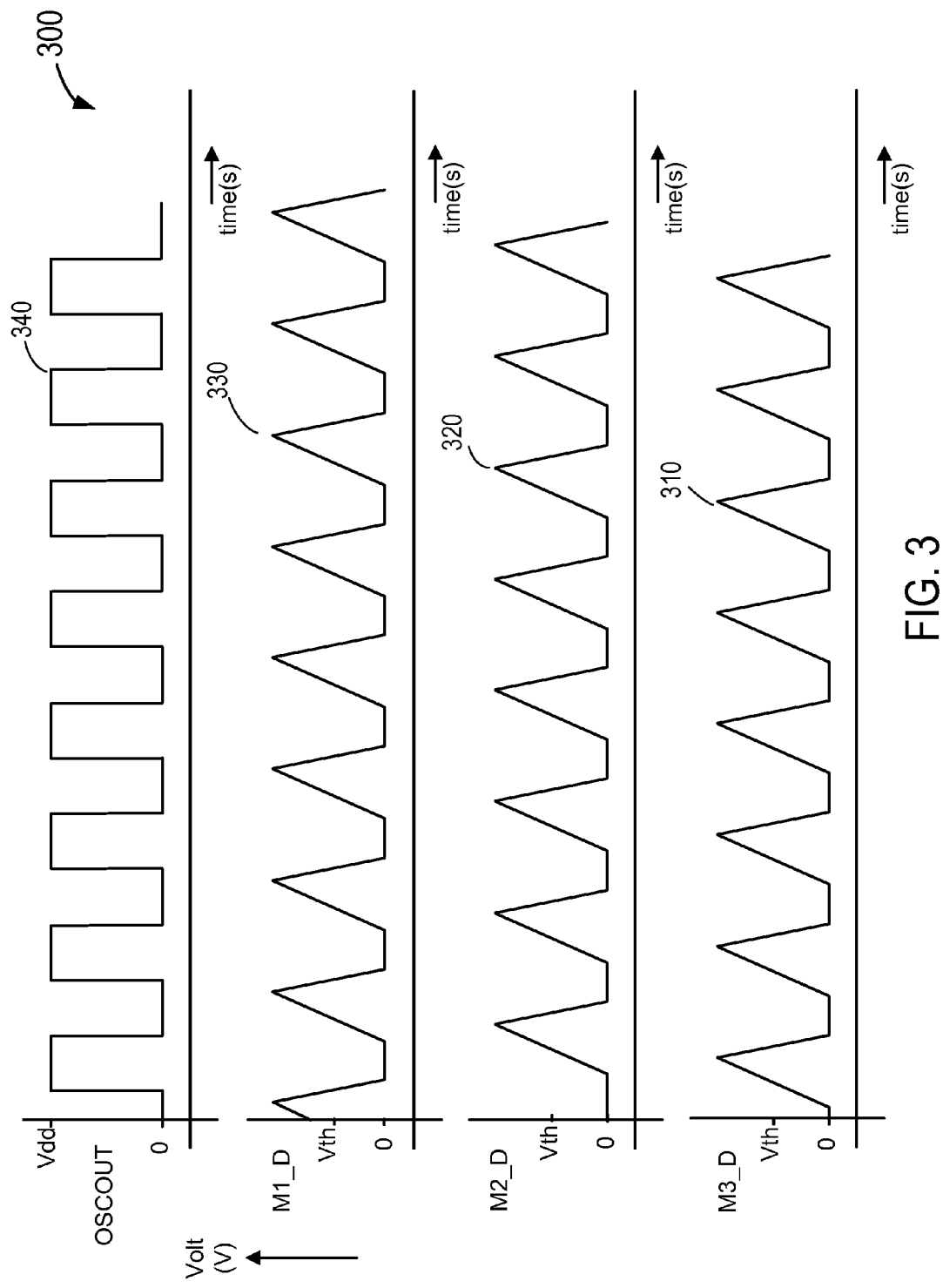
FIG. 3 is a waveform diagram illustrating simulated waveforms of an exemplary implementation of integrated oscillator circuit according to an embodiment of the present invention.

FIG. 3 is a waveform diagram illustrating simulated waveforms of an exemplary implementation of integrated oscillator circuit 200. As shown in FIG. 3, curve 310 represents the voltage at the drain terminal of transistor M1, at node 202 in FIG. 2. Curve 320 represents the voltage at the drain terminal of transistor M2, at node 204 in FIG. 2. Curve 330 represents the voltage at the drain terminal of transistor M3, at node 206 in FIG. 2. Further, curve 340 represents the output of the oscillator, at node 224 in FIG. 2.

In embodiments of the invention, in order to maintain oscillation in a feedback loop, the loop gain is kept to be at least greater than one, and the phase shift is maintained at 180 degrees. Therefore, the total number of stages need to be an odd number, and at least 3 stages are required. However, 5, 7, 9, etc., stages are also feasible. The higher the number of stages, the longer the delay, and therefore the lower the frequency. Also, adding stages increases the power consumptions. Therefore, in the embodiment of FIG. 2, three oscillator stages are chosen based on frequency and power trade-off In the example of FIG. 2, three PN junction diodes and three NMOS transistors are used. But other devices can also be used. For example, PMOS transistors can be used, instead of the NMOS transistors. Known CMOS circuit techniques can be used to modify the design of FIG. 2. Depending on the embodiments, the modification can include, for example, reversing the signal polarities, reversing power supply terminal and the ground, and changing device connections, etc. Further, in some embodiments, bipolar transistors can also be used. However, because bipolar transistors require a large base current to operate, the oscillator will need the reverse-biased diode devices to provide a large leakage current. In those embodiments, the oscillator can have large device area and higher total power consumption.

Figure 4:
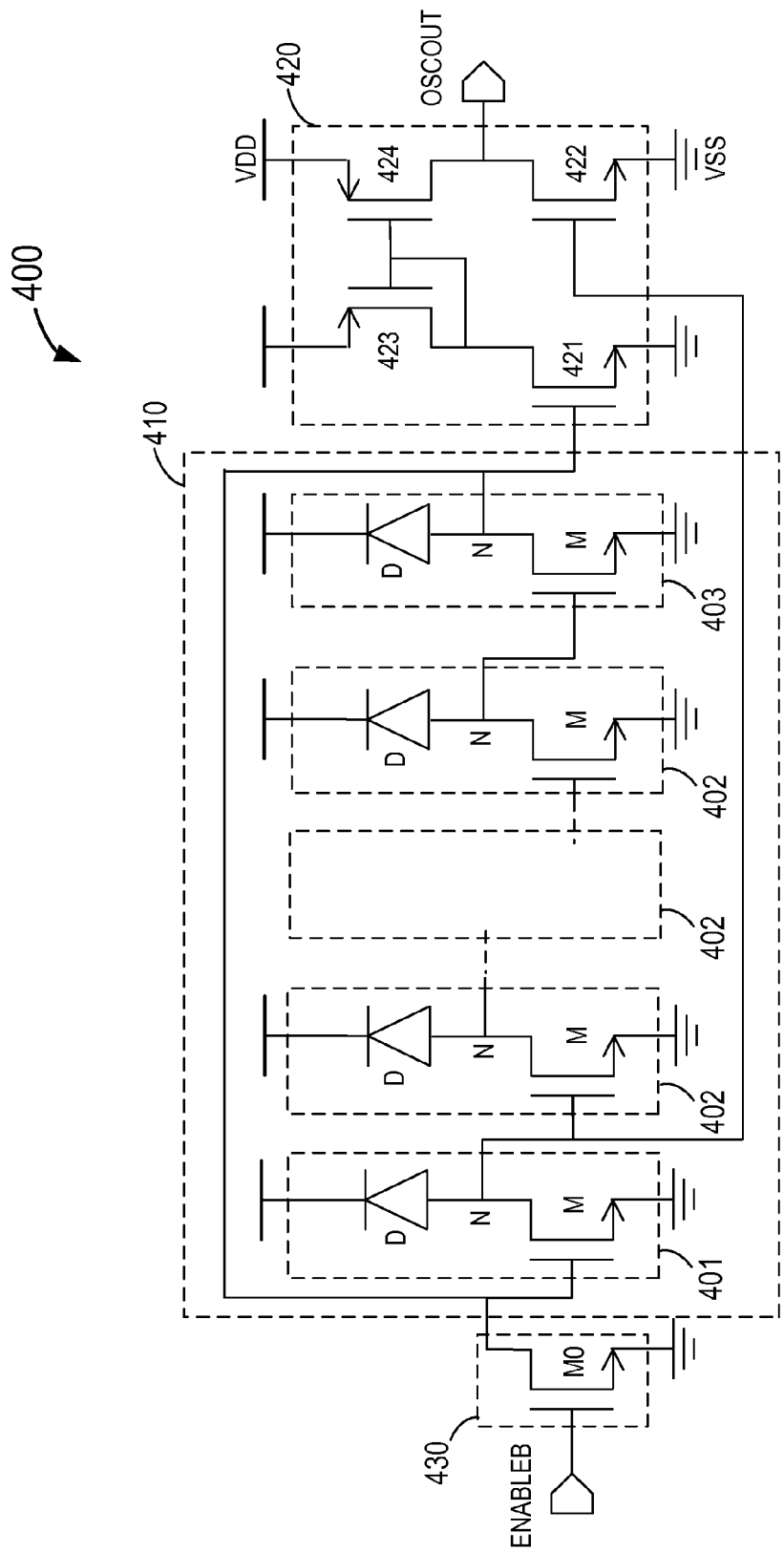
FIG. 4 is a simplified schematic diagram illustrating an integrated oscillator according to another embodiment of the present invention.

FIG. 4 is a simplified schematic diagram illustrating an integrated oscillator according to another embodiment of the present invention. As shown in FIG. 4, integrated oscillator circuit 400 has a plurality oscillator stages including a first oscillator stage 401, an odd number of intermediate oscillator stages 402, and a last oscillator stage 403 arranged in series. Depending on the embodiments, the number of intermediate oscillator stages can be any odd integer, such as 1, 3, 5, 7, 9, . . . , etc. Each of the oscillator stages has a reverse-biased diode device D and a transistor M coupled in series at an internal node N between a power supply and a ground. Each diode device has an anode and a cathode, and each transistor has a control terminal for controlling a current flow from a first terminal to a second terminal. In each oscillator stage, the anode of the diode is coupled to the first terminal of the transistor at the internal node N. The control terminal of the transistor in each oscillator stage is coupled to the internal node of a proceeding oscillator stage. Further, the control terminal of the transistor in the first oscillator stage is coupled to the internal node of the last oscillator stage.

In the example of FIG. 2, the diode devices are PN junction diodes. In other embodiments, other types of rectifying device having a well-defined reverse leakage current, such as Schottky diodes, can also be used. In some embodiments, the transistors can be MOS transistors as shown in FIG. 5. The MOS transistors can be NMOS or PMOS transistors. In these embodiments, the control terminal is the gate terminal for controlling a current flow from a source terminal to a drain terminal, or from a first terminal to a second terminal. In embodiments wherein the transistors are NMOS transistors, the anode of the diode is coupled to the drain terminal of the transistor at the internal node. In embodiments wherein the transistors are PMOS transistors, the cathode of the diode is coupled to the drain terminal of the transistor at the internal node. In alternative embodiments, the transistors can be bipolar transistors, such as NPN or PNP transistors. In these embodiments, the control terminal is the base terminal for controlling a current flow from an emitter to a collector, or from a first terminal to a second terminal. In embodiments wherein transistors are NPN bipolar transistors, the anode of the diode is coupled to the collector terminal of the transistor at the internal node. In embodiments wherein the transistors are PNP bipolar transistors, the cathode of the diode is coupled to the collector terminal of the transistor at the internal node.

In an embodiments, the integrated oscillator circuit is configured to provide a oscillation frequency Fosc that is proportional to leakage current of the diode devices Id and inversely proportional the amount of charges needed to change the state of the transistor. For an MOS transistor, the amount of charges would be related to the gate capacitances and threshold voltages of the transistors. For a bipolar transistor, the amount of charges would be related to the charges sufficient to forward bias a base-emitter junction.

As shown in FIG. 4, integrated oscillator circuit 400 also has an output buffer circuit 420 that includes a first transistor 421 having a gate coupled to the internal node N of the last oscillator stage 403, and a second transistor 422 having a gate coupled to the internal node N of the first oscillator stage 401. Integrated oscillator circuit 400 also has a third and a fourth transistors, 423 and 424, forming a current mirror. The third transistor 423 is coupled to the first transistor 421, and the fourth MOS transistor 424 is coupled to the second transistor 422. In some embodiments, the integrated oscillator circuit 400 further includes an enable transistor 430 having a gate for receiving an enable signal and a first terminal for coupling to the control terminal of the transistor in the first oscillator stage.

While the above is a description of specific embodiments of the invention, the description should not be taken as limiting the scope of the invention. It is understood that the examples and embodiments described herein are for illustrative purposes only and that various modifications or changes can be made in light thereof. These and other modifications or changes in light thereof can be suggested to persons skilled in the art and are understood to be included within the spirit and purview of this invention.

What is claimed is:

1. An integrated oscillator circuit, comprising:
a reverse-biased first diode device and a first MOS transistor coupled in series between a power supply and a ground, a cathode of the first diode device coupled to the power supply, an anode of the first diode device coupled to a drain of the first MOS transistor, and a source of the first MOS transistor coupled to the ground;
a reverse-biased second diode device and a second MOS transistor coupled in series between the power supply and the ground, a cathode of the second diode device coupled to the power supply, an anode of the second diode device coupled to a drain of the second MOS transistor, a source of the second MOS transistor coupled to the ground, and a gate of the second MOS transistor coupled to the drain of the first MOS transistor; and
a reverse-biased third diode device and a third MOS transistor coupled in series between the power supply and the ground, a cathode of the third diode device coupled to the power supply, an anode of the third diode device coupled to a drain of the third MOS transistor, a gate of the third MOS transistor coupled to the drain of the second MOS transistor, a source of the second MOS transistor coupled to the ground, and the drain of the third MOS transistor being coupled to a gate of the first MOS transistor;
wherein the integrated oscillator circuit further comprising an output buffer circuit that includes:
a fourth MOS transistor having a gate coupled to the drain of the third MOS transistor;
a fifth MOS transistor having a gate coupled to the drain of the first MOS transistor;
a sixth and a seventh MOS transistors forming a current mirror, the sixth transistor coupled to the fourth MOS transistor and the seventh MOS transistor coupled to the fifth transistor.

2. The circuit of claim 1, wherein the integrated oscillator circuit is configured to provide a oscillation frequency Fosc that is proportional to a leakage current of the diode devices and inversely proportional to gate capacitances and threshold voltages of the MOS transistors.

3. The circuit of claim 1, wherein the first, second, and third diode devices are PN junction diodes.

4. The circuit of claim 1, wherein the fourth and fifth MOS transistors are NMOS transistors, and the sixth and seventh MOS transistors are PMOS transistors.

5. The circuit of claim 1, wherein the integrated oscillator circuit further comprising an enable transistor having a drain coupled to the gate of the first MOS transistor, and a gate for receiving an enable signal.

6. An integrated oscillator circuit, comprising:
a plurality oscillator stages including a first oscillator stage, an odd number of intermediate oscillator stages, and a last oscillator stage arranged in series;
each of the oscillator stages having a reverse-biased diode device and a transistor coupled in series between a power supply and a ground, wherein:
each diode device has an anode and a cathode, and each transistor has a control terminal for controlling a current flow from a first terminal to a second terminal;
in each oscillator stage, the diode is directly connected to the transistor at a common node;
the control terminal of the transistor in each oscillator stage is directly connected to the common node of a proceeding oscillator stage; and
the control terminal of the transistor in the first oscillator stage is coupled to the common node of the last oscillator stage.

7. The circuit of claim 6, wherein the integrated oscillator circuit is configured to provide a oscillation frequency Fosc that is proportional to leakage current of the diode devices and inversely proportional to the amount of charges needed to change the state of the transistors.

8. The circuit of claim 6, wherein the integrated oscillator circuit has one intermediate oscillator stage and a total of three oscillator stages.

9. The circuit of claim 6, wherein the diode devices are PN junction diodes.

10. The circuit of claim 6, wherein the diode devices are Schottky diodes.

11. The circuit of claim 6, wherein transistors are MOS transistors, and each transistor has a gate terminal for controlling a current flow from a source terminal to a drain terminal.

12. The circuit of claim 11, wherein transistors are NMOS transistors, and, in each oscillator stage, the anode of the diode is coupled to the drain terminal of the transistor at the common node.

13. The circuit of claim 11, wherein transistors are PMOS transistors, and, in each oscillator stage, the cathode of the diode is coupled to the drain terminal of the transistor at the common node.

14. The circuit of claim 6, wherein transistors are bipolar transistors, and each transistor has a base terminal for controlling a current flow from an emitter terminal to a collector terminal.

15. The circuit of claim 14, wherein transistors are NPN bipolar transistors, and, in each oscillator stage, the anode of the diode is coupled to the collector terminal of the transistor at the internal node.

16. The circuit of claim 14, wherein transistors are PNP bipolar transistors and, in each oscillator stage, the cathode of the diode is coupled to the collector terminal of the transistor at the common node.

17. The circuit of claim 6, wherein the integrated oscillator circuit further comprising an output buffer circuit that includes:
a first transistor having a gate coupled to the common node of the last oscillator stage;
a second transistor having a gate coupled to the common node of the first oscillator stage;
a third and a fourth transistors forming a current mirror, the third transistor coupled to the first MOS transistor and the fourth MOS transistor coupled to the second transistor.

18. The circuit of claim 6, wherein the integrated oscillator circuit further comprising an enable transistor having a gate for receiving an enable signal and a first terminal for coupling to the control terminal of the transistor in the first oscillator stage.

* * * * *